(12) United States Patent
Jo et al.

(10) Patent No.: US 11,676,999 B2
(45) Date of Patent: Jun. 13, 2023

(54) ELECTRONIC DEVICES AND METHODS OF MANUFACTURING THE SAME

(71) Applicant: Samsung Electronics Co., Ltd., Suwon-si (KR)

(72) Inventors: Sanghyun Jo, Seoul (KR); Eunha Lee, Seoul (KR); Jinseong Heo, Seoul (KR); Junghwa Kim, Yongin-si (KR); Hyangsook Lee, Suwon-si (KR); Seunggeol Nam, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 136 days.

(21) Appl. No.: 17/072,737

(22) Filed: Oct. 16, 2020

(65) Prior Publication Data
US 2021/0118990 A1    Apr. 22, 2021

(30) Foreign Application Priority Data

Oct. 22, 2019    (KR) .................. 10-2019-0131390

(51) Int. Cl.
| | |
|---|---|
| *H01L 29/66* | (2006.01) |
| *H01L 29/423* | (2006.01) |
| *H01L 29/06* | (2006.01) |
| *H01L 23/29* | (2006.01) |

(52) U.S. Cl.
CPC ........ *H01L 29/0649* (2013.01); *H01L 23/291* (2013.01); *H01L 29/4236* (2013.01); *H01L 29/66977* (2013.01)

(58) Field of Classification Search
CPC ............... H01L 29/0649; H01L 23/291; H01L 21/02107; H01L 33/16
See application file for complete search history.

(56) References Cited

U.S. PATENT DOCUMENTS

| | | |
|---|---|---|
| 5,567,979 A | 10/1996 | Nashimoto et al. |
| 2005/0218456 A1 | 10/2005 | Kondo et al. |
| 2006/0118919 A1 | 6/2006 | Lo et al. |
| 2009/0261395 A1 | 10/2009 | Boescke |
| 2018/0166453 A1 | 6/2018 | Muller |
| 2019/0019683 A1 | 1/2019 | Yoo |

(Continued)

FOREIGN PATENT DOCUMENTS

| | | |
|---|---|---|
| EP | 1209729 A1 | 5/2002 |
| JP | 2005-197566 A | 7/2005 |
| KR | 10-1787298 B1 | 10/2017 |

OTHER PUBLICATIONS

Extended European Search Report dated Feb. 23, 2021 for corresponding European Application No. 20201983.2.

(Continued)

*Primary Examiner* — Fernando L Toledo
*Assistant Examiner* — Valerie N Newton
(74) *Attorney, Agent, or Firm* — Harness, Dickey & Pierce, P.L.C.

(57) ABSTRACT

An electronic device includes a dielectric layer including crystal grains having aligned crystal orientations the dielectric layer may be between a substrate and a gate electrode. The dielectric layer may be between isolated first and second electrodes. A method of manufacturing an electronic device may include preparing a substrate having a channel layer, forming the dielectric layer on the channel layer, and forming a gate electrode on the dielectric layer.

31 Claims, 13 Drawing Sheets

(56) References Cited

U.S. PATENT DOCUMENTS

| | | | |
|---|---|---|---|
| 2019/0131382 A1* | 5/2019 | Lu | H01L 29/518 |
| 2019/0148390 A1 | 5/2019 | Frank | |
| 2019/0386015 A1 | 12/2019 | Tao et al. | |
| 2020/0335333 A1* | 10/2020 | Kang | H01L 21/0228 |
| 2021/0193811 A1* | 6/2021 | Moon | H01L 29/42364 |

OTHER PUBLICATIONS

Nakhaie Siamak et al., "Nucleation and growth of atomically thin hexagonal boron nitride on Ni/MgO(111) by molecular beam epitaxy", Journal of Applied Physics, American Institute of Physics, vol. 125, No. 11: 115301, Mar. 15, 2019, XP012236259, DOI: 10.1063/5081806.

M. Park et al. 'The effects of crystallographic orientation and strain of thin $Hf_{0.5}Zr_{0.5}O_2$ film on its ferroelectricity' *Applied Physics Letters*, 104, 2014, pp. 072901-1-072901-5.

M. Hoffmann et al. 'Unveiling the double-well energy landscape in a ferroelectric layer' *Research Letter*, Nature 565, 2019, pp. 464-467.

A. Khan et al. 'Experimental evidence of ferroelectric negative capacitance in nanoscale heterostructures' *Applied Physics Letters*, 99, AIP Publishing, 2011, pp. 113501-1-113501-3.

A. Yadav et al. 'Spatially resolved steady-state negative capacitance' *Nature* 565, 2019, pp. 468-471.

M.H. Park et al. 'A comprehensive study on the structural evolution of $HfO_2$ thin films doped with various dopants' *Journal of Materials Chemistry C*, 2017, pp. 1-15, DOI: 10.1039/C7TC01200D.

L. Xu et al. 'Kinetic pathway of the ferroelectric phase formation in doped $HfO_2$ films' *Journal of Applied Physics*, 122, AIP Publishing, 2017, 124104-1-124104-7.

European Office Action dated Feb. 27, 2023 for corresponding European Application No. 20201983.2.

\* cited by examiner

ELECTRONIC DEVICES AND METHODS OF MANUFACTURING THE SAME

CROSS-REFERENCE TO RELATED APPLICATION

This application claims the benefit, under 35 U.S.C. § 119, of Korean Patent Application No. 10-2019-0131390, filed on Oct. 22, 2019, in the Korean Intellectual Property Office, the disclosure of which is incorporated herein in its entirety by reference.

BACKGROUND

1. Field

The present inventive concepts relate to electronic devices and methods and/or systems for manufacturing the same, and more particularly, to electronic devices including a dielectric layer having controlled crystal orientations and methods and/or systems for manufacturing the electronic devices.

2. Description of the Related Art

The conventional silicon-based electronic devices have limitations in improving the operating characteristics and scaling down. For example, when operating voltage and current characteristics are measured in a conventional silicon-based logic transistor, the subthreshold swing (SS) is known to be limited to about 60 mV/dec. The limitation as such may be an inhibiting factor of lowering the operating voltage to about 0.8 V or less when the size of the logic transistor decreases, and accordingly, the power density increases, thereby limiting the scaling down of the logic transistor.

SUMMARY

Some example embodiments provide electronic devices including a dielectric layer having controlled crystal orientations and methods and/or systems for manufacturing the electronic device.

Additional aspects will be set forth in part in the description which follows and, in part, will be apparent from the description, or may be learned by practice of some example embodiments of the disclosure.

According to some example embodiments, an electronic device may include a substrate, a dielectric layer on the substrate, and a gate electrode on the dielectric layer. The dielectric layer may include crystal grains having aligned crystal orientations.

The electronic device may further include a channel layer on the substrate, wherein the channel layer is overlapped with the gate electrode in a direction that is perpendicular to a top surface of the substrate, and a source and a drain are provided on opposite sides of the channel layer in a direction that is parallel to the top surface of the substrate.

The channel layer may include at least one of Si, Ge, SiGe, Group III-V semiconductors, oxide semiconductors, nitride semiconductors, oxynitride semiconductors, 2D semiconductor materials, quantum dots, or organic semiconductors.

The dielectric layer may include a ferroelectric substance.

The dielectric layer may include an oxide of at least one of Hf, Si, Al, Zr, Y, La, Gd, or Sr.

The dielectric layer may further include a dopant.

The dielectric layer may have a thickness, in a direction that is perpendicular to a top surface of the substrate, of about 0.5 nm to about 4 nm.

The crystal grains may have <111> crystal orientations.

The electronic device may further include an amorphous dielectric layer or a crystalline dielectric layer between the substrate and the dielectric layer, between the dielectric layer and the gate electrode, or combinations thereof. The crystalline dielectric layer includes crystal grains having crystal orientations that are different from the aligned crystal orientations of the crystal grains of the dielectric layer.

The amorphous dielectric layer may include an oxide of at least one of Hf, Si, Al, Zr, Y, La, Gd, or Sr.

The crystalline dielectric layer may include a 2D insulator material.

According to some example embodiments, an electronic device may include a first electrode and a second electrode isolated from direct contact with each other; and a dielectric layer between the first electrode and the second electrode. The dielectric layer may include crystal grains having aligned crystal orientations.

The first electrode and the second electrode include crystal grains having crystal orientations that are different from the aligned crystal orientations of the crystal grains of the dielectric layer.

The dielectric layer may include a ferroelectric substance.

The electronic device may further include an amorphous dielectric layer or a crystalline dielectric layer between the first electrode and the dielectric layer, between the second electrode and the dielectric layer, or combinations thereof. The crystalline dielectric layer may include crystal grains having crystal orientations different from the aligned crystal orientations of the crystal grains of the dielectric layer.

According to some example embodiments, a method of manufacturing an electronic device may include preparing a substrate having a channel layer, forming a dielectric layer on the channel layer, wherein the dielectric layer includes crystal grains having aligned crystal orientations, and forming a gate electrode on the dielectric layer.

The method may further include forming an amorphous dielectric layer or a crystalline dielectric layer between the substrate and the dielectric layer, between the dielectric layer and the gate electrode, or combinations thereof. The crystalline dielectric layer may include crystal grains having crystal orientations different from the aligned crystal orientations of the crystal grains of the dielectric layer.

The forming of the dielectric layer may include depositing an amorphous dielectric material layer on the channel layer, and then crystallizing the amorphous dielectric material layer to form the dielectric layer, such that the crystallized amorphous dielectric material layer includes the crystal grains having the aligned crystal orientations.

The dielectric layer may include a ferroelectric substance.

The dielectric layer may have a thickness of about 0.5 nm to about 4 nm.

According to some example embodiments, a method of manufacturing a computing device may include manufacturing an electronic device according to some example embodiments, and forming the computing device based on incorporating the electronic device into a computing device component.

The computing device component may include at least one of a processing circuitry or a memory.

According to some example embodiments, a method of manufacturing an electronic device may include forming a dielectric layer on a first electrode, and forming a second electrode on the dielectric layer. The first electrode and the second electrode may include a conductive metal. The dielectric layer may include crystal grains having aligned crystal orientations.

The method may further include forming at least one amorphous dielectric layer between the first electrode and the dielectric layer, between the dielectric layer and the second electrode, or combinations thereof.

The method may further include forming at least one crystalline dielectric layer between the first electrode and the dielectric layer, between the dielectric layer and the second electrode, or combinations thereof. The at least one crystalline dielectric layer may include crystal grains having crystal orientations different from the aligned crystal orientations of the crystal grains of the dielectric layer.

The forming of the dielectric layer may include depositing an amorphous dielectric material layer on the first electrode, and then crystallizing the amorphous dielectric material layer to form the dielectric layer, such that the crystallized amorphous dielectric material layer includes the crystal grains having the aligned crystal orientations.

According to some example embodiments, a method of manufacturing a computing device may include manufacturing an electronic device according to the some example embodiments, and forming the computing device based on incorporating the electronic device into a computing device component.

The computing device component may include at least one of a processing circuitry or a memory.

According to some example embodiments, a system for manufacturing an electronic device may include a process chamber including a pedestal or chuck configured to structurally support one or more devices or layers in the process chamber. The system may include a plurality of composition sources and a plurality of control devices, each composition source coupled to the process chamber via a separate control device, each control device configured to control a supply of a separate material held in a separate coupled composition source to the process chamber. The system may include processing circuitry configured to control at least the plurality of control devices to manufacture the electronic device based on preparing a substrate having a channel layer on the pedestal or chuck, forming a dielectric layer on the channel layer, wherein the dielectric layer includes crystal grains having aligned crystal orientations, and forming a gate electrode on the dielectric layer.

The processing circuitry may be further configured to control at least the plurality of control devices to form at least one amorphous dielectric layer between the substrate and the dielectric layer, between the dielectric layer and the gate electrode, or combinations thereof.

The processing circuitry may be further configured to control at least the plurality of control devices to form at least one crystalline dielectric layer between the substrate and the dielectric layer, between the dielectric layer and the gate electrode, or combinations thereof. The at least one crystalline dielectric layer may include crystal grains having crystal orientations different from the aligned crystal orientations of the crystal grains of the dielectric layer.

The forming of the dielectric layer may include depositing an amorphous dielectric material layer on the channel layer, and then crystallizing the amorphous dielectric material layer to form the dielectric layer, such that the crystallized amorphous dielectric material layer includes the crystal grains having the aligned crystal orientations.

BRIEF DESCRIPTION OF THE DRAWINGS

The above and other aspects, features, and advantages of some example embodiments of the disclosure will be more apparent from the following description taken in conjunction with the accompanying drawings, in which.

DETAILED DESCRIPTION

Figure 1:
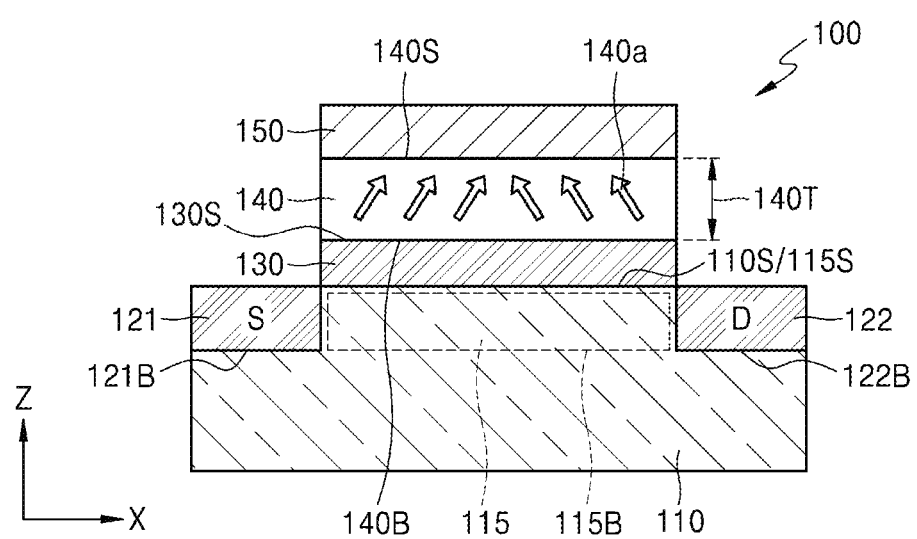
FIG. 1 is a cross-sectional view illustrating an electronic device according to some example embodiments.

Reference will now be made in detail to example embodiments, some of which are illustrated in the accompanying drawings, wherein like reference numerals refer to like elements throughout.

In this regard, some example embodiments may have different forms and should not be construed as being limited to the descriptions set forth herein.

Accordingly, some example embodiments are merely described below, by referring to the figures, to explain aspects.

As used herein, the term "and/or" includes any and all combinations of one or more of the associated listed items (e.g., A, B, and C).

Expressions such as "at least one of," when preceding a list of elements, modify the entire list of elements and do not modify the individual elements of the list. For example, "at least one of A, B, and C," and "at least one of A, B, or C" may be construed as covering any one of the following combinations: A; B; A and B; A and C; B and C; and A, B, and C."

Hereinafter, what is described as "on top of" or "over" may include not only directly over (e.g., overlapping in a vertical direction) and in contact but also overlying where intervening elements and/or spaces are present. When an element or layer is referred to as being "on" or "above" another element or layer, the element or layer may be directly on the other element or layer (e.g., in direct contact therewith), or the element or layer may be indirectly on the other element or layer (e.g., isolated from direct contact with the other element or layer by one or more interposing spaces and/or structures). Where an element is described as being directly between two other elements, the element may be in direct contact with each of the two other elements, for example opposite sides or surfaces of the element may each be in direct contact with a separate element of the two other elements.

Singular expressions include plural expressions unless the context clearly indicates otherwise. The use of the term "the" and similar terminology may be used in the singular and the plural. In regard to the steps constituting a method, unless there are explicit descriptions on orders or otherwise, the steps may be performed in a suitable order. It is not necessarily limited to the order described in connection with the steps. The use of all examples or example terms is merely for the purpose of describing technical concepts in detail, and the examples or example terms would not limit the range unless they are limited by the claimed range.

In addition, when a part is said to "include" a certain component, this means that it may further include other components, and not exclude other components unless otherwise stated. The use of the term "above" and similar terminology may be used in the singular and the plural forms. If the steps constituting the method are not explicitly stated as having a respective order or as having a contrary to the respective order, the steps may be performed in a suitable order. It is not necessarily limited to the order provided in the description of the above steps. The use of all examples or example terms is merely for the purpose of describing technical concepts in detail, and the scope of the present disclosure is not to be limited by the use of the examples or example terms unless defined by the claims.

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof (e.g., structures, properties of one or more elements, lengths, distances, energy levels, energy barriers, or the like) described herein as being the "substantially" the same encompasses elements and/or properties thereof (e.g., structures, properties of one or more elements, lengths, distances, energy levels, energy barriers, or the like) that are the same within manufacturing tolerances and/or material tolerances and/or elements and/or properties thereof (e.g., structures, properties of one or more elements, lengths, distances, energy levels, energy barriers, or the like) that have a relative difference in magnitude that is equal to or less than 10%. Further, regardless of whether elements and/or properties thereof (e.g., structures, properties of one or more elements, lengths, distances, energy levels, energy barriers, or the like) are modified as "substantially," it will be understood that these elements and/or properties thereof (e.g., structures, properties of one or more elements, lengths, distances, energy levels, energy barriers, or the like) should be construed as including a manufacturing or operational tolerance (e.g., ±10%) around the stated elements and/or properties thereof (e.g., structures, properties of one or more elements, lengths, distances, energy levels, energy barriers, or the like).

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

Where elements, properties, or the like are described herein to have a "small" or "very small" difference between each other, it will be understood that a variation between the magnitudes of said elements and/or properties may be equal to or less than 10% of the magnitudes of the elements, properties, or the like being described.

Throughout the specification, it will be understood that, although the terms first, second, etc. may be used herein to describe various elements, these elements, should not be limited by these terms. These terms are only used to distinguish one element from another element.

It will be understood that, where an element, layer, structure, or the like is described herein to be "made of" and/or "formed of" one or more materials, the element, layer, structure, or the like may "at least partially comprise" said one or more materials.

FIG. 1 is a cross-sectional view illustrating an electronic device 100 according to some example embodiments. The electronic device 100 illustrated in FIG. 1, as a semiconductor-based device, may have a gate stack structure having a ferroelectric substance and a gate electrode. The electronic device 100 as such may be, for example, a logic device or a memory device.

Referring to FIG. 1, the electronic device 100 includes a substrate 110, an amorphous dielectric layer 130, a dielectric layer 140, and the gate electrode 150. A channel layer 115 is at a position corresponding to the gate electrode 150 on (e.g., on top of) the substrate 110 (e.g., channel layer 115 may be overlapped, also referred to herein as being aligned, with the gate electrode 150 in a direction that is perpendicular to a top surface 110S of the substrate 110, such as the Z-direction shown in FIG. 1), and a source S 121 and a drain D 122 may be provided at (e.g., on, directly contacting, etc.) both (e.g., opposite) sides of the channel layer 115 in a direction that is parallel to the top surface 110S of the substrate 110 (e.g., the X-direction shown in FIG. 1). As shown in FIG. 1, source 121 may be electrically connected to one side of the channel layer 115, and the drain 122 may be electrically connected to the other, opposite side of the channel layer 115. The source 121 and drain 122 may be formed based on implanting impurities into different regions of the substrate 110, and the region of the substrate 110 between the source 121 and the drain 122 in a direction that is parallel to the top surface 110S of the substrate 110 (e.g., the X-direction shown in FIG. 1) may be defined as the channel layer 115. Accordingly, the channel layer 115 may be a portion of the substrate 110 having side boundaries defined by the source 121 and the drain 122, a bottom boundary 115B defined by the bottom boundaries 121B and 122B of the source 121 and drain 122, a top surface 115S of the channel layer 115 may be a portion (e.g., limited portion) of the top surface 110S extending between the source 121 and the drain 122. The portions of the top surface 110S that are top surfaces of one of the source 121 or the drain 122 may be exposed from layers 130-150, as shown in FIG. 1. Such a channel layer 115 that is a portion of the substrate 110 will be understood to be "on" the substrate 110.

As shown in FIG. 1, the source 121 and drain 122 may be on opposite sides of the channel layer 115 in a direction that is parallel to the top surface 110S of the substrate 110 (e.g., the X-direction shown in FIG. 1). The depth of the channel layer 115 may be defined by the depth of the source 121 and the drain 122 from a top surface 110S of the substrate 110 a direction extending perpendicular to surface 110S, which may be the Z-direction shown in FIG. 1. As shown in FIG. 1, each of layers 130-150 may be at least partially vertically overlapped (e.g., may completely overlap as shown in FIG. 1) with the channel layer 115 (e.g., overlapping in a direction extending perpendicular to surface 110S, which may be the Z-direction shown in FIG. 1), and the source 121 and the drain 122 may be exposed (e.g., completely exposed as shown in FIG. 1) by the stack of layers 130-150.

The substrate 110 may be, in some example embodiments, a Si substrate, but may be a substrate including materials other than Si, such as Ge, SiGe, Group III-V semiconductors, oxide semiconductors, nitride semiconductors, oxynitride semiconductors, two-dimensional (2D) semiconductor materials, quantum dots, or organic semiconductors, any combination thereof, or the like. In some example embodiments, the channel layer 115, which may be part of the substrate 110 as shown in FIG. 1 or a separate piece of material in relation to the substrate 110, may include at least one of Si, Ge, SiGe, Group III-V semiconductors, oxide semiconductors, nitride semiconductors, oxynitride semiconductors, two-dimensional (2D) semiconductor materials, quantum dots, or organic semiconductors. The materials of the substrate 110 are not limited thereto, and may be variously changed.

In some example embodiments, as described below, the channel layer 115 may be formed as a material layer being separate from the substrate 110 (e.g., a separate piece of material in relation to the substrate 110) instead of the material layer being part of the substrate 110 (e.g., the channel layer 115 being a portion of a single piece of material that at least partially comprises the substrate 110) as shown in FIG. 1. The amorphous dielectric layer 130 is provided on top of the surface of the channel layer 115 of the substrate 110 (e.g., the portion of surface 110S that extends between the source 121 and the drain 122 and defines the upper boundary of the channel layer 115). Accordingly, it will be understood that the amorphous dielectric layer 130 may be on (e.g., directly on) the substrate 110.

The amorphous dielectric layer 130 may include, for example, an oxide of at least one of Hf, Si, Al, Zr, Y, La, Gd, or Sr, but is not limited thereto. The amorphous dielectric layer 130 may be deposited on top of the channel layer 115 of the substrate 110 (e.g., directly on, and in contact with, the portion of surface 110S that defines a top surface 115S of the channel layer 115 as shown in FIG. 1) by deposition methods such as chemical vapor deposition (CVD), atomic layer deposition (ALD), physical vapor deposition (PVD), or the like.

In addition, the dielectric layer 140 including crystal grains having aligned crystal orientations 140a (e.g., at least some, or all, of the crystal grains may have crystal orientations that may be aligned, e.g., may extend in parallel, a particular direction) is provided on top of the amorphous dielectric layer 130 (e.g., directly on a top surface 130S of the amorphous dielectric layer 130). The amorphous dielectric layer 130 is provided between (e.g., directly between as shown in FIG. 1) the channel layer 115 and the dielectric layer 140 of the substrate 110 (e.g., in direct contact with both surfaces 110S and 140B), thereby the amorphous dielectric layer 130 is unaffected by the crystal structure of the substrate 110, and the amorphous dielectric layer 130 may be configured to assist the crystal grains of the dielectric layer 140 to have the crystal orientations 140a aligned to a particular (or, alternatively, predetermined) direction. In some example embodiments, the amorphous dielectric layer 130 may be between the dielectric layer 140 and the gate electrode 150 (e.g., directly therebetween). In some example embodiments, an electronic device 100 may include a first amorphous dielectric layer 130 between (e.g., directly between) the channel layer 115 and the dielectric layer 140, and a second amorphous dielectric layer between (e.g., directly between) the dielectric layer 140 and the gate electrode 150. In some example embodiments, the amorphous dielectric layer 130 may be absent from the electronic device 100, such that dielectric layer 140 may be on, or directly on the substrate 110 (e.g., in direct contact with the portion of surface 110S defining a top surface 115S of the channel layer 115). In some example embodiments a crystalline dielectric layer may be included in the electronic device 100 in any of the positions described above with regard to the amorphous dielectric layer 130 (e.g., the electronic device 100 may include at least one crystalline dielectric layer instead of at least one amorphous dielectric layer 130). Accordingly, it will be understood that the electronic devices according to any of the example embodiments may include at least one amorphous dielectric layer (e.g., 130) or at least one crystalline dielectric layer, where the at least one amorphous dielectric layer (e.g., 130) or at least one crystalline dielectric layer may be between the dielectric layer (e.g., 140) and a first layer (e.g., substrate 110), between the dielectric layer (e.g., 140) and a second layer at an opposite side of the dielectric layer (e.g., gate electrode 150), or combinations thereof (e.g., a first amorphous dielectric layer or crystalline dielectric layer between the dielectric layer 140 and the substrate 110 and a second amorphous dielectric layer or crystalline dielectric layer between the dielectric layer 140 and the gate electrode 150).

Figure 2:
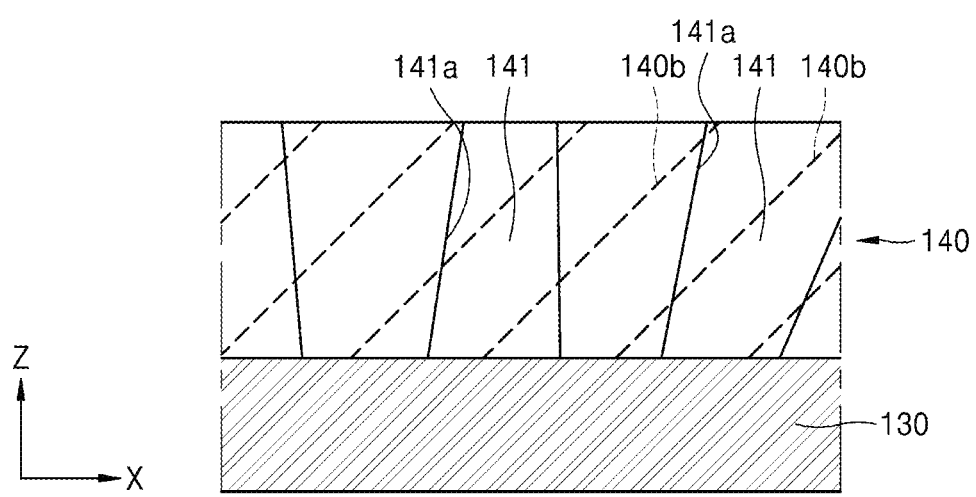
FIG. 2 is an enlarged cross-sectional view of a dielectric layer illustrated in FIG. 1.

FIG. 2 is an enlarged cross-sectional view of the dielectric layer illustrated in FIG. 1. Referring to FIG. 2, the dielectric layer 140 may include a plurality of crystal grains 141 defined by grain boundaries 141a.

Here, the crystal grains 141 constituting the dielectric layer 140 may have crystal orientations 140a of FIG. 1 aligned to a particular (or, alternatively, predetermined) direction. In FIG. 2, reference 140b represents the crystal planes of the crystal grains 141 constituting (e.g., at least partially comprising) the dielectric layer 140, and in general, the crystal planes 140b may be perpendicular to the crystal orientations 140a. The crystal planes 140b may be parallel to each other. The crystal grains 141 constituting the dielectric layer 140 may have, for example, <111> crystal orientations. <111> represents Miller index indicating the crystal orientations in crystallography.

Here, the <111> crystal orientation is representative of, for example, [111], [−111], [1-11], [11-1], [−1-11], [−11-1], [1-1-1], and/or [−1-1-1] crystal orientations. However, this is merely an example and the crystal grains 141 constituting the dielectric layer 140 may have crystal orientations other than the <111> crystal orientation.

The dielectric layer 140 may include (e.g., at least partially comprise) the ferroelectric substance.

The ferroelectric substance has a crystalline material structure, wherein the charge distribution within the unit cell in the crystalline material structure is non-centrosymmetric, thereby the ferroelectric substance has an electric dipole, i.e., spontaneous polarization.

The ferroelectric substance has remnant polarization caused by dipole even in the absence of an external electric field. In addition, the direction of polarization may switch to units of domains by the external electric field. The ferroelectric substance may or may not have hysteresis characteristics depending on the external electric field. In some example embodiments, the dielectric layer 140 may not include any ferroelectric substance.

The dielectric layer 140 may include, for example, an oxide of at least one of Hf, Si, Al, Zr, Y, La, Gd, or Sr, but this is merely an example. In addition, the dielectric layer 140 may further include a dopant, but example embodiments are not limited thereto. Here, the dopant may include, for example, at least one of Si, Al, Zr, Y, La, Gd, Sr, or Hf. When the dopant is included in the dielectric layer 140, the dopant may be doped having the same concentration as a whole, or having different concentrations depending on the regions of the dielectric layer 140.

In addition, different doping materials may be doped depending on the regions of the dielectric layer 140. As described below, the dielectric layer 140 may be formed based on depositing an amorphous dielectric material layer on top of the amorphous dielectric layer 130 (e.g., directly on the top surface 130S) based on deposition methods such as chemical vapor deposition (CVD), atomic layer deposition (ALD), physical vapor deposition (PVD), or the like, and then crystallizing thereof. As the amorphous dielectric material layer is crystallized based on annealing, the crystal grains 141 having the crystal orientations 140a aligned in particular (or, alternatively, predetermined) directions, including for example aligned in a single, particular, direction, may grow to form the dielectric layer 140 having the controlled crystal orientations 140a. The dielectric layer 140 may have a thickness 140T of about 0.5 nm to about 4 nm, for example, but example embodiments are not limited thereto. The gate electrode 150 is provided on (e.g., on top of) the dielectric layer 140 (e.g., directly on top surface 140S).

The gate electrode 150 may be positioned (e.g., may be configured) to face the channel layer 115 of the substrate 110 (e.g., to overlap, partially or completely, with the channel layer 115 in the Z-direction that is perpendicular to top surface 110S). The gate electrode 150 as such may include a conductive metal. Here, the gate electrode 150 may have crystal orientations different from the crystal orientation(s) of the dielectric layer 140. The electronic device 100 according to some example embodiments has the ferroelectric substance constituting the dielectric layer 140, thereby lowering the subthreshold swing (SS) of the electronic device 100. Accordingly, performance of the electronic device 100 may be improved based on including the ferroelectric substance including crystal grains having aligned crystal orientations (e.g., crystal grains oriented in a particular, e.g., singular, same direction, crystal grains oriented in parallel in a particular direction, etc.)

Figure 3:
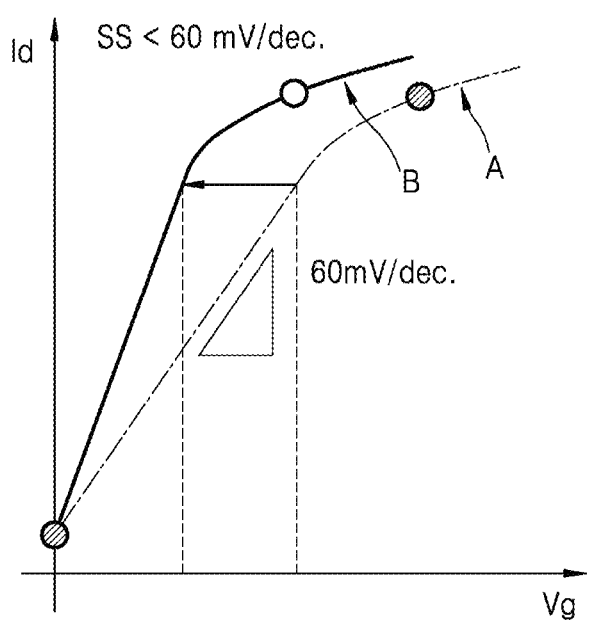
FIG. 3 is a graph illustrating an improved subthreshold swing (SS) characteristic of the electronic device according to some example embodiments.

FIG. 3 is a graph illustrating the improved subthreshold swing (SS) characteristic of a logic transistor (e.g., the electronic device shown in FIGS. 1-2 that includes a dielectric layer including crystal grains having aligned crystal orientations) according to some example embodiments. In FIG. 3, curve "A" illustrates operating voltage (Vg) and current (Id) characteristics of a conventional silicon-based logic transistor (e.g., conventional silicon-based electronic device), and curve "B" illustrates operating voltage (Vg) (e.g., in mV) and current (Id) (e.g., in A/μm²) characteristics of the logic transistor (e.g., electronic device) according to some example embodiments of the present disclosure. Referring to FIG. 3, a conventional silicon-based transistor has the subthreshold swing (SS) known to be limited to about 60 mV/dec at room temperature (300K).

The logic transistor (e.g., electronic device) according to some example embodiments of the present disclosure includes a ferroelectric layer, thereby voltage amplification is generated by negative capacitance effect, and thereby the subthreshold swing SS for the logic transistor according to some example embodiments that includes a ferroelectric layer, as shown in curve "B" may be lowered, in relation to the subthreshold swing for a conventional silicon-based logic transistor as shown in curve "A", to about 60 mV/dec or less. The electronic device 100 according to some example embodiments includes the dielectric layer 140 having the ferroelectric substance, wherein the ferroelectric substance has the crystal grains 141 having the aligned crystal orientations 140a, and thereby the polarization characteristics of the dielectric layer 140 and the performance of the electronic device 100 may be improved. In the conventional electronic device having a ferroelectric substance, crystal grains of the ferroelectric substance are arranged in random directions. However, in the electronic device 100 according to some example embodiments of the present disclosure, the dielectric layer 140 includes the ferroelectric substance, wherein the ferroelectric substance includes the crystal grains 141 having the aligned crystal orientations 140a, thereby the dielectric layer 140 may have relatively larger remnant polarization than the conventional electronic device, and thereby the polarization characteristics of the dielectric layer 140 may be improved.

In addition, in the electronic device 100 according to some example embodiments, polarization directions of the dielectric layer 140 are aligned in a particular direction, thereby depolarization field is increased, and thereby the negative capacitance effect may be increased. Accordingly, the subthreshold swing SS of the electronic device 100 may be lowered (e.g., below about 60 mV/dec), and thereby the performance of the electronic device 100 may be further improved. In the example embodiments shown in FIGS. 1-2, the amorphous dielectric layer 130 provided between the channel layer 115 of the substrate 110 and the dielectric layer 140 has been described, but a crystalline dielectric layer (not shown) may be provided between the channel layer 115 of the substrate 110 and the dielectric layer 140, in addition to or in place of the amorphous dielectric layer 130, as described herein. Accordingly, the layer shown with label "130" in FIG. 1 (and the similar layers 330, 430 shown in FIGS. 4, 5, and 6B-6D) may be a crystalline dielectric layer instead of an amorphous dielectric layer. Here, the crystalline dielectric layer may include crystal grains having crystal orientations different from the crystal orientations of the crystal grains of the dielectric layer 140 thereon.

The crystalline dielectric layer, like the amorphous dielectric layer 130 described above, may be provided between the channel layer 115 of the substrate 110 and the dielectric layer 140, and thereby the crystalline dielectric layer may be unaffected by the crystal structure of the substrate 110 and assist the crystal grains of the dielectric layer 140 to have the crystal orientations 140a aligned to a particular (or, alternatively, predetermined) direction. The crystalline dielectric layer may be located between (e.g., directly between) the channel layer 115 and the dielectric layer 140, between (e.g., directly between) the dielectric layer 140 and the gate electrode 150, or combinations thereof (e.g., there may be multiple separate crystalline dielectric layers in the electronic device 100).

The crystalline dielectric layer may include, for example, a 2D insulator material such as hexagonal-Boron Nitride (h-BN), or the like. However, this is merely an example, and the crystalline dielectric layer may include various other dielectric materials.

In the above, the amorphous dielectric layer 130 or the crystalline dielectric layer provided between the channel layer 115 of the substrate 110 and the dielectric layer 140 has only been described, but the amorphous dielectric layer 130 or the crystalline dielectric layer may be additionally provided between the dielectric layer 140 and the gate electrode 150 (e.g., directly between the dielectric layer 140 and the gate electrode 150). The amorphous dielectric layer 130 or the crystalline dielectric layer may not be provided between the channel layer 115 of the substrate 110 and the dielectric layer 140, but may be provided between the dielectric layer 140 and the gate electrode 150. The amorphous dielectric layer 130 or the crystalline dielectric layer may be a plurality of separate layers, where one layer (e.g., a first layer) is between the channel layer 115 and the dielectric layer 140, and another layer (e.g., a second layer) is between the dielectric layer 140 and the gate electrode 150.

In some example embodiments, the dielectric layer 140 is directly provided on top of the channel layer 115 of the substrate 110 (e.g., is in direct contact with the top surface 115S of the channel layer 115), wherein the dielectric layer 140 includes the crystal grains 141 having crystal orientations 140a aligned to a direction different from the crystal orientations of crystal grains of the substrate 110.

The amorphous dielectric layer 130 or the crystalline dielectric layer described above may not be provided. In other words, the dielectric layer 140 including the crystal grains 141 having the aligned crystal orientations 140a may be directly provided on top of the channel layer 115 of the substrate 110.

Here, the dielectric layer 140 may include the crystal grains 141 having aligned crystal orientations 140a arranged to different directions from the crystal orientations of the substrate 110.

Figure 4:
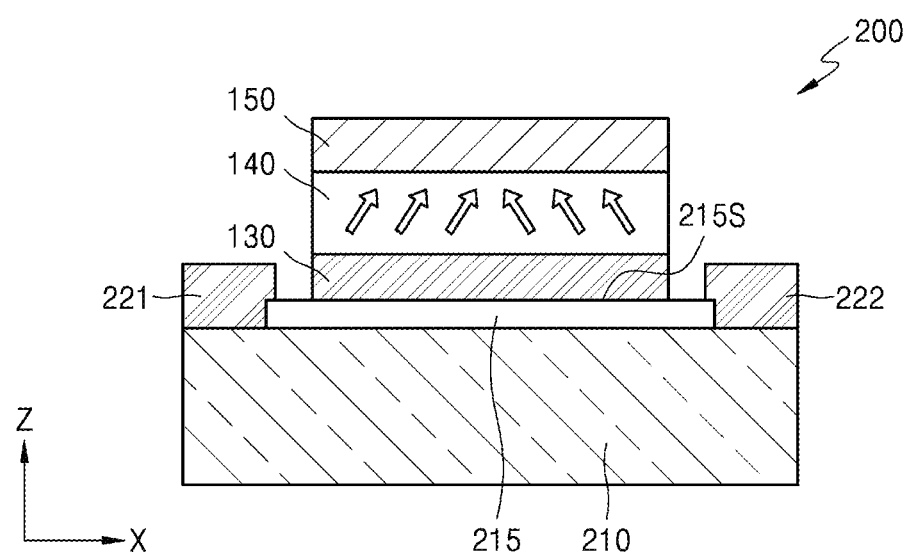
FIG. 4 is a cross-sectional view illustrating the electronic device according to some example embodiments.

FIG. 4 is a cross-sectional view illustrating the electronic device according to some example embodiments.

The following description will focus on differences from the above-described example embodiments. Referring to FIG. 4, an electronic device 200 includes a substrate 210, a channel layer 215, the amorphous dielectric layer 130, the dielectric layer 140, and the gate electrode 150. A source electrode 221 and a drain electrode 222 may be provided at both (e.g., opposite) sides of the channel layer 215.

The substrate 210 may include, but is not limited to, at least one of Si, Ge, SiGe, Group III-V semiconductors, oxide semiconductors, nitride semiconductors, oxynitride semiconductors, 2D semiconductor materials, quantum dots, organic semiconductors, or the like. The channel layer 215 may be provided on (e.g., directly on, as shown in FIG. 4) the top surface of the substrate 210, although example embodiments are not limited thereto.

The channel layer 215 may be provided as a material layer being separate from the substrate 210 that is not part of the substrate 210 (e.g., is part of a separate piece of material in relation to the substrate 210). The channel layer 215 may include, for example, at least one of an oxide semiconductor, a nitride semiconductor, an oxynitride semiconductor, a two-dimensional material (2D material), a quantum dot, or an organic semiconductor. Here, the oxide semiconductor may include, for example, InGaZnO, and the two-dimensional material may include, for example, transition metal dichalcogenide (TMD) or graphene, and the quantum dots may include colloidal QDs, nanocrystal structures, or the like.

However, this is merely an example and some example embodiments are not limited thereto. The source electrode 221 and the drain electrode 222 may be provided at both (e.g., opposite) sides of the channel layer 215. The source electrode 221 may be connected to one side of the channel layer 215, and the drain electrode 222 may be connected to the other, opposite side of the channel layer 215.

The source electrode 221 and the drain electrode 222 may be formed of (e.g., may at least partially comprise) a conductive material such as a metal, a metal compound, or a conductive polymer. Since the amorphous dielectric layer 130, the dielectric layer 140, and the gate electrode 150 sequentially stacked on top of the channel layer 215 have been described above, a detailed description thereof is omitted.

The crystalline dielectric layer (not shown) may be provided on (e.g., on top of) the channel layer 215 (e.g., directly on the top surface 215S of the channel layer 215) instead of the amorphous dielectric layer 130. Here, the crystalline dielectric layer may include the crystal grains having crystal orientations different from the crystal grains of the dielectric layer 140 thereon.

Figure 5:
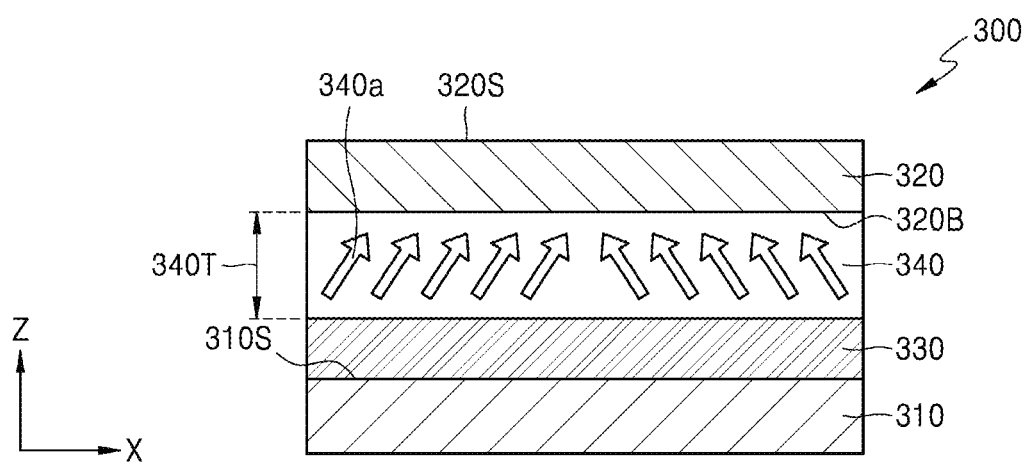
FIG. 5 is a cross-sectional view illustrating the electronic device according to some example embodiments.

FIG. 5 is a cross-sectional view illustrating the electronic device according to some example embodiments. The electronic device 300 illustrated in FIG. 5 may be, for example, a capacitor. Referring to FIG. 5, the electronic device 300 includes a first electrode 310 and a second electrode 320 spaced apart from each other (e.g., isolated from direct contact with each other) in the Z-direction, which may be a direction perpendicular to the top surface of one or both of the first or second electrodes 310 or 320 (e.g., one or both of top surfaces 310S, 320S), and an amorphous dielectric layer 330 and a dielectric layer 340 provided between (e.g., directly between) the first electrode 310 and the second electrode 320. The amorphous dielectric layer 330 may be provided on top of the first electrode 310 (e.g., directly on the top surface 310S), and the dielectric layer 340 may be provided between (e.g., directly between) the amorphous dielectric layer 330 and the second electrode 320 (e.g., such that the dielectric layer 340 may be in direct contact with a bottom surface 320B of the second electrode 320). Here, the dielectric layer 340 may include the ferroelectric substance according to any example embodiments, but example embodiments are not limited thereto and in some example embodiments the dielectric layer 340 may not include any ferroelectric substances. The first electrode 310 and the second electrode 320 may each include the conductive metal. In some example embodiments, the amorphous dielectric layer 330 may be absent, and the dielectric layer 340 may be between (e.g., directly between) the first and second electrodes 310 and 320 (e.g., in direct contact with both surfaces 310S, 320B at opposite sides of the dielectric layer 340).

In some example embodiments, the electronic device 300 may be the capacitor having a metal-ferroelectric-insulator-metal (MFIM) structure. The 310 may include a semiconductor, and the second electrode 320 may include the conductive metal. In such case, the electronic device 300 may be the capacitor having a metal-ferroelectric-insulator-semiconductor (MFIS) structure.

The amorphous dielectric layer 330 is provided on (e.g., directly on) the top surface 310S of the first electrode 310. The amorphous dielectric layer 330 may include, for example, an oxide of at least one of Hf, Si, Al, Zr, Y, La, Gd, or Sr, but is not limited thereto. The amorphous dielectric layer 330 as such may be deposited on the top surface 310S of the first electrode 310 by, for example, deposition methods such as chemical vapor deposition (CVD), atomic layer deposition (ALD), physical vapor deposition (PVD), or the like.

The amorphous dielectric layer 330 is provided between the first electrode 310 and the dielectric layer 340 (e.g., directly therebetween), and thereby the amorphous dielectric layer 330 is unaffected by the crystal structure of the first electrode 310 and may be configured to assist the crystal grains of the dielectric layer 340 to have crystal orientations 340a aligned to a particular (or, alternatively, predetermined) direction. The dielectric layer 340 is provided on top of the amorphous dielectric layer 330.

In some example embodiments, the dielectric layer 340 may include the crystal grains having the crystal orientations 340a aligned to a particular (or, alternatively, predetermined) direction according to any of the example embodiments, including any of the example embodiments of dielectric layer 140. The crystal grains constituting the dielectric layer 340 may have, for example, <111> crystal orientations, but are not limited thereto. In addition, the dielectric layer 340 may include the crystal grains having the crystal orientations such that said crystal orientations are different from the crystal orientations of the first electrode 310 and the second electrode 320. Restated, the first electrode 310 and the second electrode 320 may each have crystal grains having crystal orientations that are different from the aligned crystal orientations of the crystal grains of the dielectric layer 340.

The dielectric layer 340 may include, for example, an oxide of at least one of Hf, Si, Al, Zr, Y, La, Gd or Sr, but this is merely an example. The dielectric layer 340 may further include the dopant. Here, the dopant may include, for example, at least one of Si, Al, Zr, Y, La, Gd, Sr, or Hf. The dielectric layer 340 may have, for example, a thickness 340T of about 0.5 nm to about 4 nm.

In the electronic device 300 according to some example embodiments, the ferroelectric substance of the dielectric layer 340 has the crystal grains having aligned crystal orientations 340a, thereby the dielectric layer 340 has a larger remnant polarization than conventional electronic devices, thereby the polarization characteristics of the dielectric layer 340 may be improved, and thereby the capacitance thereof may be increased accordingly. In the above, the amorphous dielectric layer 330 provided between the first electrode 310 and the dielectric layer 340 has been described, but the crystalline dielectric layer (not shown) may be provided between the first electrode 310 and the dielectric layer 340. Here, the crystalline dielectric layer may include crystal grains having crystal orientations different from the aligned crystal orientations of the crystal grains of the dielectric layer 340 thereon. For example, the crystalline dielectric layer may include a two-dimensional insulating material such as h-BN, or the like. However, this is merely an example, and the crystalline dielectric layer may include various other dielectric materials.

In the above, the amorphous dielectric layer 330 or the crystalline dielectric layer are provided between the dielectric layer 340 and the first electrode 310 has been described, but the amorphous dielectric layer 330 or the crystalline dielectric layer may be additionally provided between the dielectric layer 340 and the second electrode 320. A crystalline dielectric layer may be located between (e.g., directly between) the channel layer 215 and the dielectric layer 340, between (e.g., directly between) the dielectric layer 340 and the second electrode 320, or any combination thereof (e.g., there may be multiple separate crystalline dielectric layers in the electronic device 300). In some example embodiments, an electronic device 300 may include at least one amorphous dielectric layer 330 or crystalline dielectric layer.

In some example embodiments, the amorphous dielectric layer 330 or the crystalline dielectric layer may not be provided between the first electrode 310 and the dielectric layer 340, but may be provided between the dielectric layer 340 and the second electrode 320. In such case, the dielectric layer 340 is directly provided on the top surface 310S of the first electrode 310, wherein the dielectric layer 340 includes the crystal grains having the crystal orientations aligned to a direction different from the crystal orientations of the first electrode 310. The amorphous dielectric layer 330 or the crystalline dielectric layer described above may not be provided. In such case, the dielectric layer 340 is directly provided on the top surface 310S of the first electrode 310, wherein the dielectric layer 340 includes the crystal grains having the crystal orientations 340a aligned to a direction different from the crystal orientations of the first electrode 310. When the first electrode 310 and the second electrode 320 each include the conductive metal, the capacitor having a metal-ferroelectric-metal (MFM) structure may be provided, and when the first electrode 310 and the second electrode 320 include the semiconductor and the conductive metal, the capacitor having a metal-ferroelectric-semiconductor (MFS) structure may be provided.

FIG. 6A 6B, 6C, and FIG. 6D are diagrams for describing a method of manufacturing the electronic device according to some example embodiments.

Figure 6A:
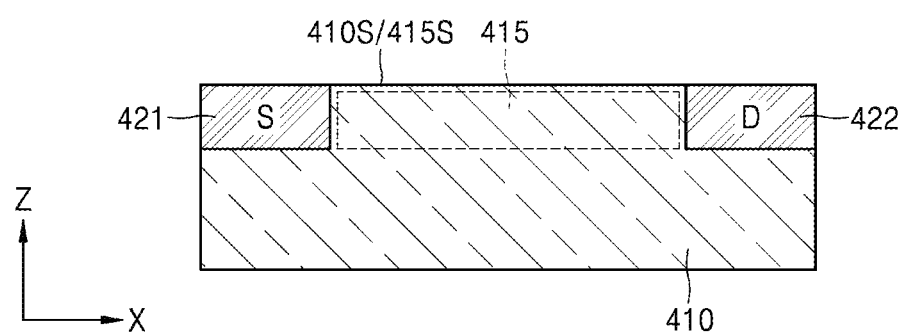
FIGS. 6A, 6B, 6C, and 6D are diagrams illustrating a method of manufacturing an electronic device according to some example embodiments.

Referring to FIG. 6A, a substrate 410 having a channel layer 415, a source S 421, and a drain D 422 is prepared. The source 421 and the drain 422 may be formed by implanting/doping impurities in different regions from each other of the substrate 410, where said regions are isolated from each other in the X-direction (e.g., a direction parallel to the top surface 410S of the substrate 410, and the region of the substrate 410 between the source 421 and the drain 422 may be defined as the channel layer 415. The substrate 410 may include, for example, Si, Ge, SiGe, Group III-V semiconductors, oxide semiconductors, nitride semiconductors, oxynitride semiconductors, two-dimensional (2D) semiconductor materials, quantum dots, or organic semiconductors, any combination thereof, or the like. In some example embodiments, the channel layer 415 may include Si, Ge, SiGe, Group III-V semiconductors oxide semiconductors, nitride semiconductors, oxynitride semiconductors, two-dimensional (2D) semiconductor materials, quantum dots, or organic semiconductors, any combination thereof, or the like. The material of the substrate 410 is not limited to the above and may be variously changed. As shown in FIG. 6A, the channel layer 415 may be part of a same piece of material as the remainder of the substrate 410, such that the channel layer 415 may be defined as a region of the substrate 410 that has side and bottom boundaries in the substrate 410 that are defined at least partially by the source 421 and the drain 422 and has a top boundary that is a portion of the top surface 410S extending between the source 421 and drain 422, such portion of the top surface 410S being referred to herein as a top surface 415S of the channel layer 415. The channel layer 415 may be referred to as being formed "on" the substrate 410, even though the channel layer 415 and the remainder of the substrate 410 may be part of a single piece of material.

The formation time of the source 421 and the drain 422 may vary.

For example, the source 421 and the drain 422 may be formed on the substrate 410 after a gate electrode 450 shown in FIG. 6D, which will be described later, is formed. The channel layer 415 may be formed on top of the substrate 410 as a material layer being separate from the substrate 410 that is not part of the substrate 410 (e.g., the channel layer 415 may be a separate piece of material in relation to the substrate 410). In such case, the material composition of the channel layer 415 may vary in relation to the material composition of the substrate 410. For example, the channel layer 415 may include at least one of an oxide semiconductor, a nitride semiconductor, a nitride oxide semiconductor, a 2D material, a quantum dot, or an organic semiconductor. The oxide semiconductor may include, for example, InGaZnO or the like, and the two-dimensional material may include, for example, TMD or graphene, and the quantum dot may include a colloidal quantum dot, a nanocrystalline structure, or the like, but this is merely an example, and some example embodiments are not limited thereto.

Figure 6B:
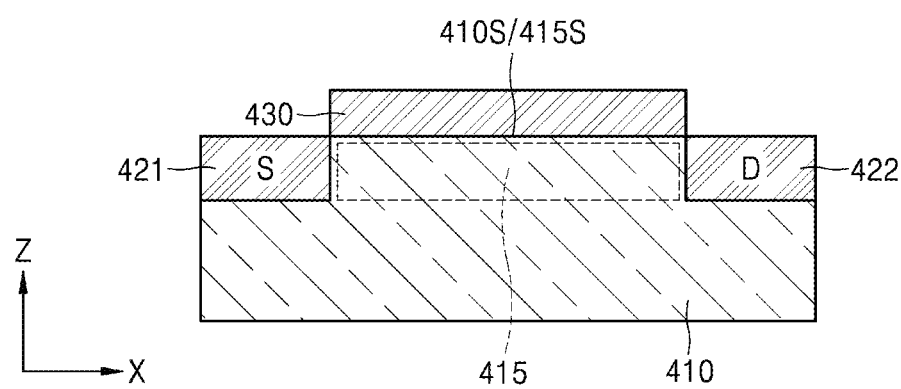

Referring to FIG. 6B, an amorphous dielectric layer 430 is formed on (e.g., on top of) the channel layer 415 of the substrate 410, for example directly on the channel layer 415 such that the amorphous dielectric layer 430 is in direct contact with top surface 415S. Here, the amorphous dielectric layer 430 may include, for example, an oxide of at least one of Hf, Si, Al, Zr, Y, La, Gd, or Sr, but example embodiments are not limited thereto. The amorphous dielectric layer 430 may be provided between (e.g., directly between) the channel layer 415 of the substrate 410 and the dielectric layer 440 thereof described later, and thus the amorphous dielectric layer 430 is unaffected by the crystal structure of the substrate 410 and may be configured to assist the crystal grains of the dielectric layer 440 to have the crystal orientations 440a of FIG. 6C aligned to a particular (or, alternatively, predetermined) direction.

The amorphous dielectric layer 430 may be deposited on top of the channel layer 415 of the substrate 410 (e.g., directly on the top surface 415S) based on, for example, deposition methods such as chemical vapor deposition (CVD), atomic layer deposition (ALD), physical vapor deposition (PVD), or the like. The amorphous dielectric layer 430 may be formed based on treating the top surface 410S of the substrate 410 using, for example, SC1 solution, or may be formed by oxygenating the top surface 410S of the substrate 410 and then heating the top surface 410S of the substrate 410.

Figure 6C:
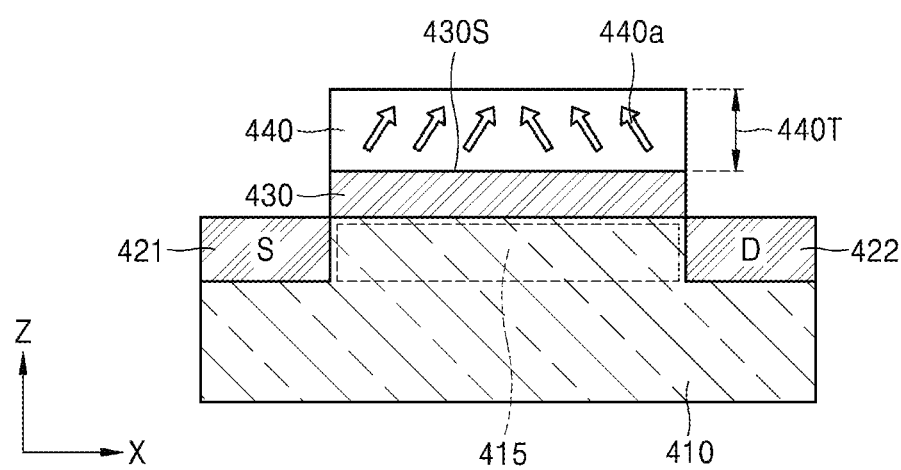

In some example embodiments, the formation of the amorphous dielectric layer 430 may be omitted, and the dielectric layer 440 formed as shown in FIG. 6C may be formed directly on the channel layer 415 (e.g., directly on the top surface 415S).

Referring to FIG. 6C, the dielectric layer 440 is formed on (e.g., on top of) the amorphous dielectric layer 430. For example, as shown, the dielectric layer 440 may be formed directly on the top surface 430S of the amorphous dielectric layer 430.

Here, the dielectric layer 440 may include crystal grains having the crystal orientations 440a aligned in particular (or, alternatively, predetermined) directions as described with regard to any example embodiments.

The crystal grains constituting the dielectric layer 440 may have, for example, <111> crystal orientations, but are not limited thereto. The dielectric layer 440 may include the ferroelectric substance as described with regard to any example embodiments.

The dielectric layer 440 may include an oxide of at least one of Hf, Si, Al, Zr, Y, La, Gd, or Sr, but this is merely an example. The dielectric layer 440 may further include a dopant. Here, the dopant may include, for example, at least one of Si, Al, Zr, La, Gd, Sr, or Hf. When the dopant is included in the dielectric layer 440, the dopant may be doped having the same concentration as a whole (e.g., a concentration of the dopant throughout the dielectric layer 440 is uniform or substantially uniform), or having different concentrations depending on the regions of the dielectric layer 440 (e.g., non-uniform concentration of dopant throughout the dielectric layer 440). Different doping materials may be doped depending on the regions of the dielectric layer 440 (e.g., the dielectric layer 440 may include different doping materials in different regions of the dielectric layer 440).

The dielectric layer 440 may be formed based on depositing an amorphous dielectric material layer on the channel layer 415 (e.g., on top of the amorphous dielectric layer 430, for example directly on the top surface 430S), and then crystallizing the amorphous dielectric material layer such that the crystallized amorphous dielectric material layer includes crystal grains having aligned crystal orientations, such that the crystallized amorphous dielectric material layer is the dielectric layer 440. In some example embodiments, the amorphous dielectric material layer is deposited directly on the top surface 415S of the channel layer 415 and crystallized to form the dielectric layer 440. Here, the amorphous dielectric material layer may be deposited on top of the amorphous dielectric layer 430 (e.g., directly on the top surface 430S) and/or on the channel layer 415 based on, for example, chemical vapor deposition (CVD), atomic layer deposition (ALD), physical vapor deposition (PVD), or the like. In addition, the amorphous dielectric material layer may be formed as the dielectric layer 440 by being crystallized through annealing. During the crystallization of the amorphous dielectric material layer, the crystal grains having the crystal orientations 440a aligned to a particular (or, alternatively, predetermined) direction may grow to form the dielectric layer 440, such that the crystallized amorphous dielectric material layer is the dielectric layer 440.

The formation of the dielectric layer 440 may depend on the material constituting the dielectric layer 440, the type and concentration of the dopant, the annealing temperature, or the like. The annealing temperature of the amorphous dielectric material layer may be, for example, from about 300° C. to about 1000° C., but is not limited thereto. The dielectric layer 440 may be formed having a thickness 440T of about 0.5 nm to about 4 nm, but this is merely an example.

Figure 6D:
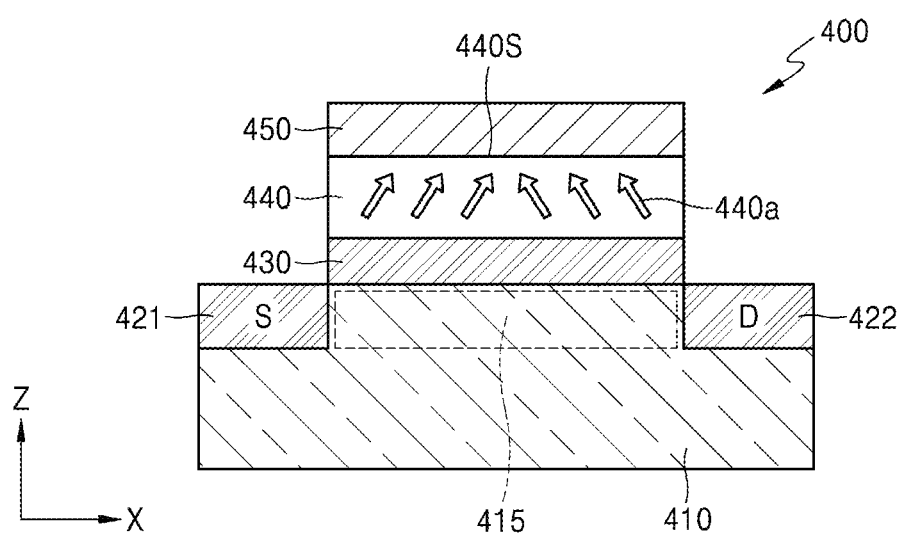

Referring to FIG. 6D, the electronic device 400 is completed based on forming the gate electrode 450 on top of the dielectric layer 440 (e.g., directly on top surface 440S. The gate electrode 450 may be formed based on depositing the conductive material on top of the dielectric layer 440 (e.g., directly on the top surface 440S) based on, for example, chemical vapor deposition (CVD), physical vapor deposition (PVD), atomic layer deposition (ALD), or the like.

In such case, annealing may be additionally performed after the gate electrode 450 is formed.

Here, the gate electrode 450 may include crystal grains having crystal orientations different from the aligned crystal orientations of the dielectric layer 440. In the above, the dielectric layer 440 is provided based on forming the amorphous dielectric material layer on top of the amorphous dielectric layer 430, and then crystallizing the amorphous dielectric material layer by annealing before forming the gate electrode 450 thereon.

However, some example embodiments are not limited thereto, and the dielectric layer 440 may be provided based on forming the amorphous dielectric material layer on top of the amorphous dielectric layer 430, then depositing the conductive material thereon to form the gate electrode 450, and then annealing. In such case, the dielectric layer 440 may be formed based on the crystallization of the amorphous dielectric material layer by annealing (e.g., based on application of heat to the amorphous dielectric material layer from a heat source as described herein). In the above, although at least one amorphous dielectric layer 430 formed on top of the channel layer 415 of the substrate 410 has been described, at least one crystalline dielectric layer (not shown) may be formed instead of the amorphous dielectric layer 430, such that the layer "430" shown in FIGS. 6B-6D may be a crystalline dielectric layer instead of an amorphous dielectric layer 430.

Here, the crystalline dielectric layer may include crystal grains having crystal orientations different from the aligned crystal orientations of the crystal grains of the dielectric layer 440. In the above, although the amorphous dielectric layer 430 or the crystalline dielectric layer formed between the channel layer 415 of the substrate 410 and the dielectric layer 440 have been described, the amorphous dielectric layer 430 or the crystalline dielectric layer may be additionally formed between the dielectric layer 440 and the gate electrode 450. Meanwhile, the amorphous dielectric layer 430 or the crystalline dielectric layer may not be formed between the channel layer 415 of the substrate 410 and the dielectric layer 440, and may be formed only between the dielectric layer 440 and the gate electrode 450. In such case, the dielectric layer 440 is directly formed on top of the channel layer 415 of the substrate 410, wherein the dielectric layer 440 includes the crystal grains having the crystal orientations 440a aligned to a direction different from the crystal orientations of the substrate 410. The amorphous dielectric layer 430 or the crystalline dielectric layer described above may not be provided. In such case, the dielectric layer 440 is formed directly on top of the channel layer 415 of the substrate 410, wherein the dielectric layer 440 includes the crystal grains having the crystal orientations 440a aligned to a direction different from the crystal orientations of the substrate 410. According to the above embodiments, the subthreshold swing of the electronic device may be lowered by the ferroelectric substance included within the dielectric layer.

In addition, a ferroelectric substance may be included in the dielectric layer 440 and the ferroelectric substance may include the crystal grains having the aligned crystal orientations, thereby increasing the remnant polarization thereof, and thereby improving the polarization characteristics of a ferroelectric thin film. In addition, the polarization directions are aligned, thereby increasing the depolarization field, thereby lowering the subthreshold swing by increasing the negative capacitance effect, and thereby further improving the performance of the electronic device. It should be understood that some example embodiments described herein should be considered in a descriptive sense only and not for purposes of limitation. Descriptions of features or aspects within each example embodiment should typically be considered as available for other similar features or aspects in other embodiments.

It will be understood that the electronic devices 100, 200, and 300 may be formed (e.g., manufactured) via a method that is similar to the method shown in FIGS. 6A-6D. For example, with regard to the electronic device 300 shown in FIG. 5, a method for manufacturing the electronic device 300 may include providing a first electrode 310 that is as described above with reference to FIG. 5. In addition, the method for manufacturing the electronic device 300 may include forming a dielectric layer 340 on the first electrode 310 via a method similar or the same as the process for forming the dielectric layer 440 as described above with reference to FIG. 6C, where the dielectric layer 440 includes crystal grains having aligned crystal orientations. The dielectric layer 340 may be formed directly on the first electrode 310 (e.g., directly on the top surface 310S thereof) or on an amorphous dielectric layer 330 or a crystalline dielectric layer that is formed between the first electrode 310 and the dielectric layer 440. In some example embodiments, forming the dielectric layer 340 may include depositing an amorphous dielectric material layer on the first electrode 310 (e.g., directly on the first electrode 310, directly on an amorphous dielectric layer 330 that is on the first electrode 310, etc.), and then crystallizing the amorphous dielectric material layer to form the dielectric layer 340 (e.g., based on generating heat at a heat source such that the heat is applied to the amorphous dielectric material layer to implement annealing and thus crystallization of the amorphous dielectric material layer, such that the crystallized amorphous dielectric material layer includes the crystal grains having the aligned crystal orientations 340a. In addition, the method for manufacturing the electronic device 300 may include forming a second electrode 320 on the dielectric layer 340 via a method similar or the same as the process for forming the gate electrode 450 as described above with reference to FIG. 6D.

In some example embodiments, the method of forming the electronic device 300 may include forming an amorphous dielectric layer 330 on the first electrode 310 via a method similar or the same as the process for forming the amorphous dielectric layer 430 as described above with reference to FIG. 6B.

It will be understood that the amorphous dielectric layers 130, 330, 430 as shown in FIGS. 1-2, 3-6 may be replaced by a crystalline dielectric layer as described herein according to some example embodiments (e.g., between the channel layer 115 and dielectric layer 140 as described with regard to the amorphous dielectric layer 130). In some example embodiments, at least one amorphous dielectric layer 330 (and/or at least one crystalline dielectric layer) may be formed between the first electrode 310 and the dielectric layer 340 as shown in FIG. 5, between the dielectric layer 440 and the second electrode 320, or combinations thereof (e.g., multiple amorphous dielectric layers and/or crystalline dielectric layers may be formed between different sets of layers as described herein).

Figure 7:
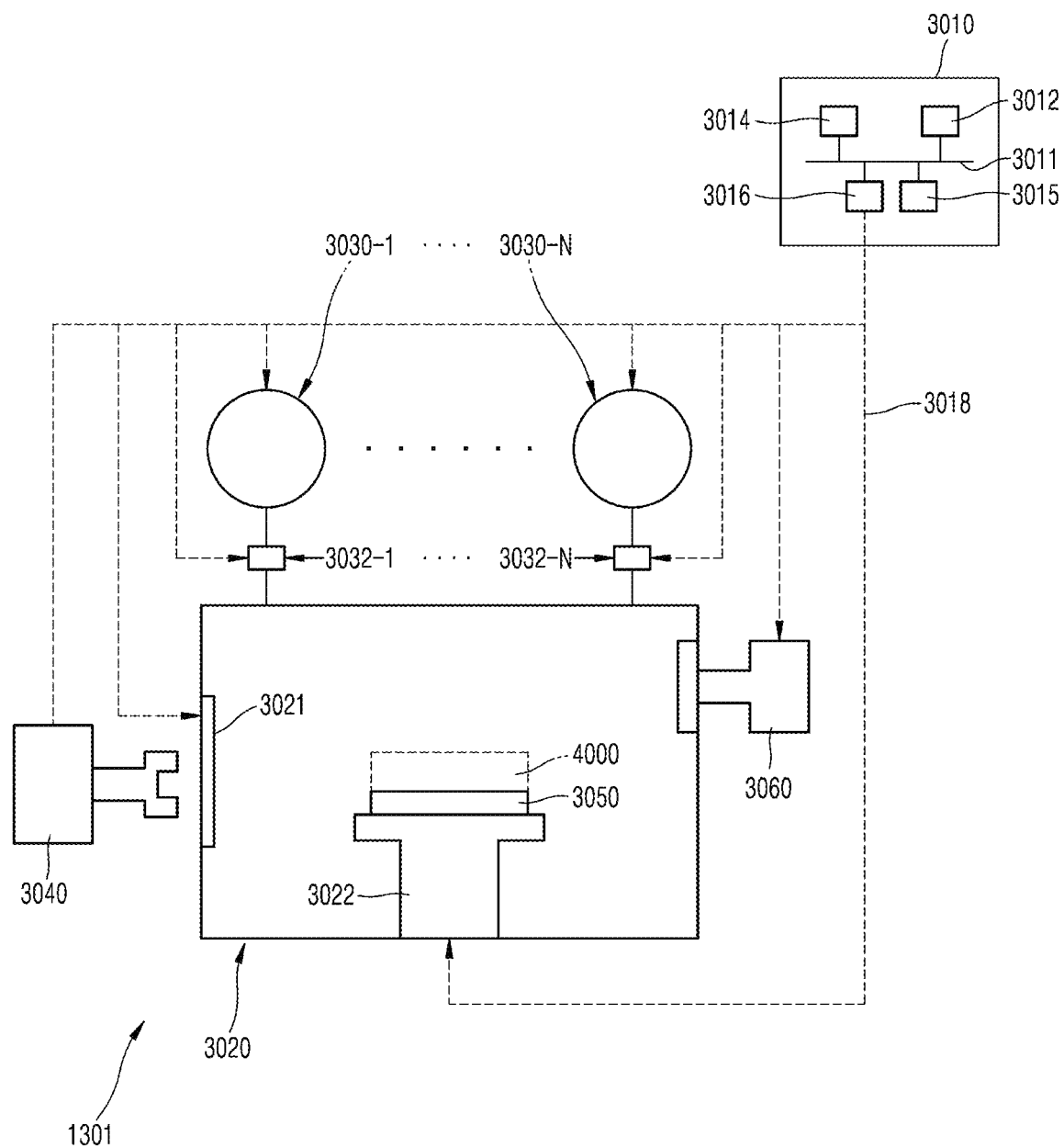
FIG. 7 shows a schematic of a system configured to control the manufacturing of an electronic device according to some example embodiments.

FIG. 7 shows a schematic of a system 1301 configured to control the formation (also referred to herein interchangeably as "fabrication" or "manufacturing") of an electronic device according to some example embodiments. As used herein, a system 1301 may be referred to as a "set."

Referring to FIG. 7, system 1301 includes a computing device 3010 (also referred to herein interchangeably as an electronic device), a manipulator device 3040, composition (e.g., gas, fluid, etc.) sources 3030-1 to 3030-N (where N is a positive integer), a heat source 3060, and a process chamber 3020.

Referring first to the computing device 3010, the computing device 3010 may include processing circuitry 3012 (also referred to herein as simply a processor), memory 3014, a power supply 3015, and a communication interface 3016 that are communicatively and/or electrically coupled together via a bus 3011.

The computing device 3010 may be included in one or more various electronic devices, including, for example, a mobile phone, a digital camera, a sensor device, or the like. In some example embodiments, the computing device 3010 may include one or more of a server, a mobile device, a personal computer (PC), a tablet computer, a laptop computer, a netbook, some combination thereof, or the like. A mobile device may include a mobile phone, a smartphone, a personal digital assistant (PDA), some combination thereof, or the like. The computing device 3010 may be referred to herein as simply "processing circuitry."

The memory 3014, the processing circuitry 3012, the power supply 3015, and the communication interface 3016 may communicate with one another through the bus 3011.

The communication interface 3016 may communicate data to and/or from an external device using various communication protocols. In some example embodiments, the communication interface may be connected to an electronic line (e.g., wire) and may be configured to receive and process electrical signals from one or more external devices.

The processing circuitry 3012 may execute a program and control one or more aspects of the system 1301, via the communication interface 3016 as shown in FIG. 7. A program code to be executed by the processing circuitry 3012 may be stored in the memory 3014.

The memory 3014 may store information. The memory 3014 may be a volatile or a nonvolatile memory. The memory 3014 may be a non-transitory computer readable storage medium. The memory may store computer-readable instructions that, when executed, cause the execution of one or more methods, functions, processes, etc. as described herein. In some example embodiments, the processing circuitry 3012 may execute one or more of the computer-readable instructions stored at the memory 3014 to cause the system 1301 to perform some of all of the methods described herein, including the method illustrated in FIGS. 6A-6B and/or FIG. 10, and/or any method for forming (e.g., "fabricating," "manufacturing," etc.) any electronic devices according to any of the example embodiments.

In some example embodiments, the communication interface 3016 may include a USB and/or HDMI interface. In some example embodiments, the communication interface 3016 may include a wireless communication interface.

Still referring to FIG. 7, the process chamber 3020 may be any of the process chambers described herein and may include a pedestal and/or chuck 3022 that is configured to structurally support a substrate 3050 upon which an electronic device 4000 (which may be any of the example embodiments of electronic devices according to any of the example embodiments described herein) according to any of the example embodiments may be formed (e.g., "fabricated," "manufactured," etc.). In some example embodiments, the substrate 3050 may be at least a portion of a substrate, first electrode, or the like that is at least partially included in the electronic device 4000 according to any example embodiments (e.g., substrate 110, substrate 210, first electrode 310, substrate 410, or the like). As shown, the pedestal and/or chuck 3022 may be coupled to a motor such that the electronic device 3010 (e.g., "processing circuitry") may be configured to cause the pedestal and/or chuck 3022 to move, via control signals communicated from communication interface 3016, for example to enable the substrate 3050 and/or electronic device 4000 to be moved within, into, and/or out of the process chamber 3020.

Still referring to FIG. 7, system 1301 includes a manipulator device 3040, which may be any device for manipulating thin-film structures and/or substrates into and/or out of a process chamber 3020, and the process chamber 3020 may include a portal 3021 (e.g., door) via which the manipulator device 3040 may access the interior of the process chamber 3020 to provide a substrate 3050 and/or to retrieve at least an electronic device 4000 formed therein. As shown, the manipulator device 3040 and the portal 3021 may be controlled by the electronic device 3010 (e.g., "processing circuitry").

Still referring to FIG. 7, the system 1301 includes one or more composition sources 3030-1 to 3030-N (N being a positive integer) which may store various materials, including any materials, dopants, and/or compositions described herein, or any combination thereof, as described herein. The materials may be stored as a gas, as a liquid, as a solid, as any type of fluid, or any combination thereof. As shown, each separate composition source is coupled to the process chamber 3020 via a separate supply control device 3032-1 to 3032-N (e.g., control valve), where each control device 3032-1 to 3032-N is configured (e.g., based on being a control valve) to control a supply of a separate material held in a separate (e.g., corresponding) coupled composition source 3030-1 to 3030-N to the process chamber. The composition sources 3030-1 to 3030-N and/or control devices 3032-1 to 3032-N may be controlled by electronic device 3010 (e.g., "processing circuitry").

Still referring to FIG. 7, system 1301 includes a heat source 3060, which may be a heating device, heating element, heater, or the like that may be utilized to generate heat and provide the generated heat to the process chamber 3020 (e.g., to heat at least a portion of the process chamber 3020), for example implement annealing of an amorphous dielectric material layer as described herein. As shown, the heat source 3060 may be controlled by the electronic device 3010 (e.g., "processing circuitry").

As shown in FIG. 7, the electronic device 3010 (e.g., "processing circuitry") may, for example based on processing circuitry 3012 executing a program of instruction stored on memory 3014, communicate with various elements of the system 1301 via communication lines 3018 to cause the system 1301 to form an electronic device 4000 according to any example embodiments herein (e.g., form any of the electronic devices 100, 200, 300, 400 as described herein with regard to any example embodiments, including any of the methods described herein with reference to FIGS. 6A-6D). It will be understood that the system 1301 may omit one or more of the elements shown in FIG. 7 (e.g., the heat source 3060, the pedestal or chuck 3022, or the like).

Figure 8:
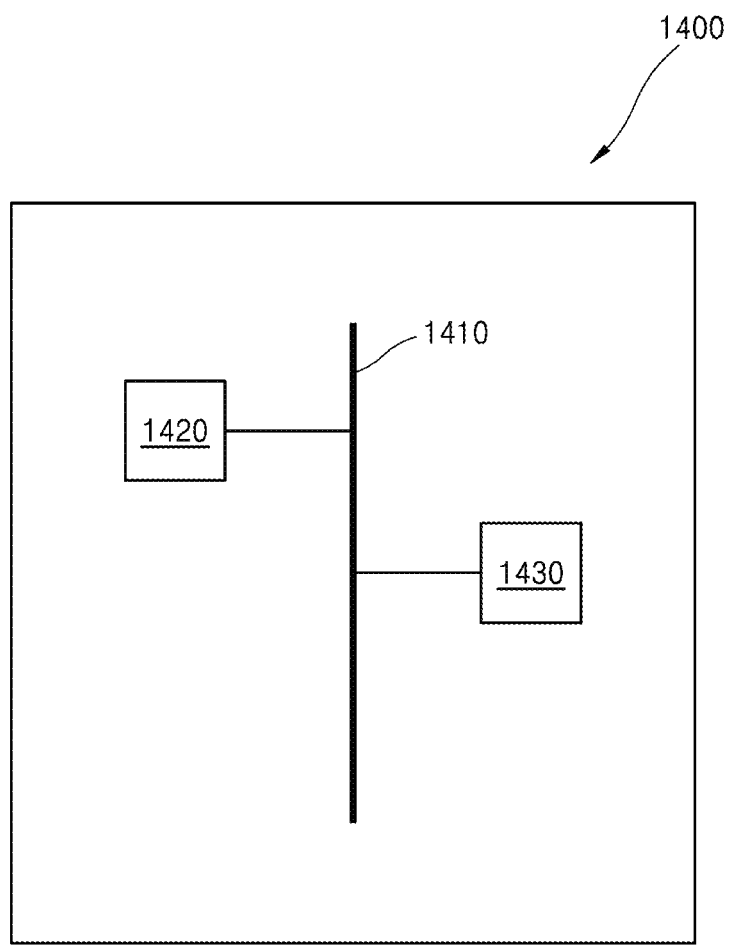
FIG. 8 shows a schematic of an electronic device that may include the electronic device according to some example embodiments.

FIG. 8 shows a schematic of an electronic device according to some example embodiments.

As shown, the electronic device 1400 includes one or more electronic device components, including a processor (e.g., processing circuitry) 1420 and a memory 1430 that are communicatively coupled together via a bus 1410. The electronic device 1400 may be referred to herein as a "computing device."

The processing circuitry 1420, may be included in, may include, and/or may be implemented by one or more instances of processing circuitry such as hardware including logic circuits, a hardware/software combination such as a processor executing software; or a combination thereof. For example, the processing circuitry 1420 may include, but is not limited to, a central processing unit (CPU), an application processor (AP), an arithmetic logic unit (ALU), a graphic processing unit (GPU), a digital signal processor, a microcomputer, a field programmable gate array (FPGA), a System-on-Chip (SoC) a programmable logic unit, a microprocessor, or an application-specific integrated circuit (ASIC), etc. In some example embodiments, the memory 1430 may include a non-transitory computer readable storage device, for example a solid state drive (SSD), storing a program of instructions, and the processing circuitry 1420 may be configured to execute the program of instructions to implement the functionality of the electronic device 1400.

In some example embodiments, the electronic device 1400 (e.g., "computing device") may include an electronic device (e.g., logic transistor) according to any of the example embodiments in one or more of the processing circuitry 1420 or the memory 1430, where said electronic device includes at least a dielectric layer including crystal grains having aligned crystal orientations, and where said electronic device including the dielectric layer is included. Said electronic device included in the electronic device 1400 (e.g., "computing device") may include a ferroelectric substance. The electronic device 1400 (e.g., "computing device") may exhibit improved operational performance as a result, e.g., based on one or more portions of the electronic device 1400 (e.g., the processing circuitry 1420 and/or memory 1430) having improved characteristics.

Figure 9:
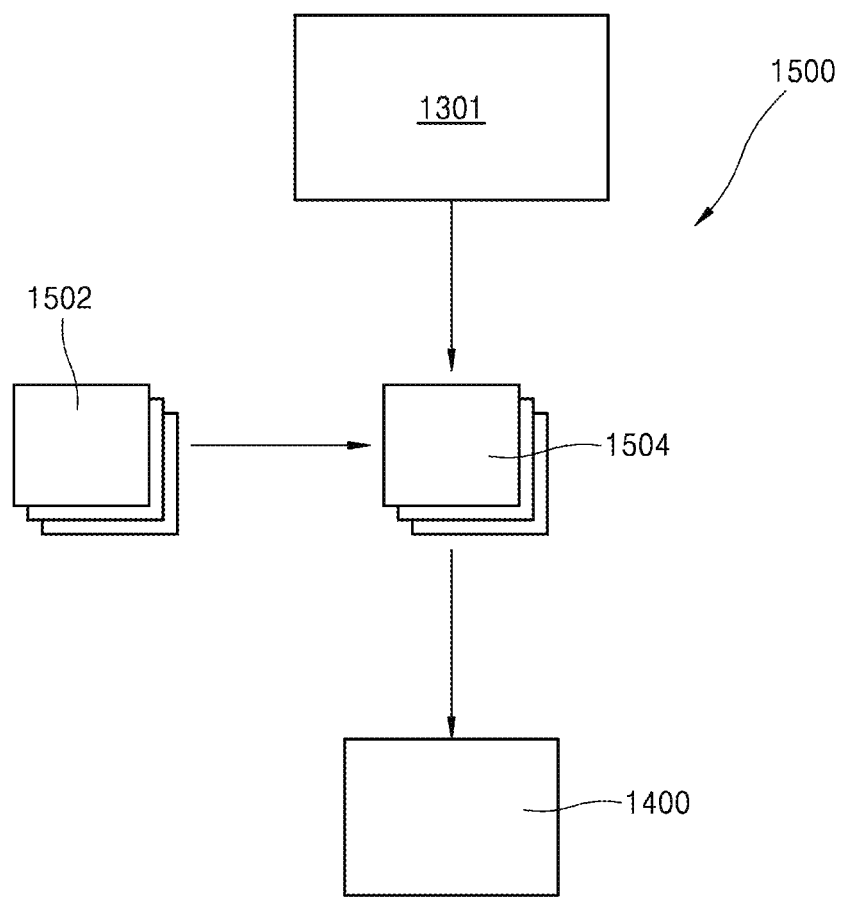
FIG. 9 shows a schematic of a system configured to control the manufacturing of an electronic device according to some example embodiments.
Figure 10:
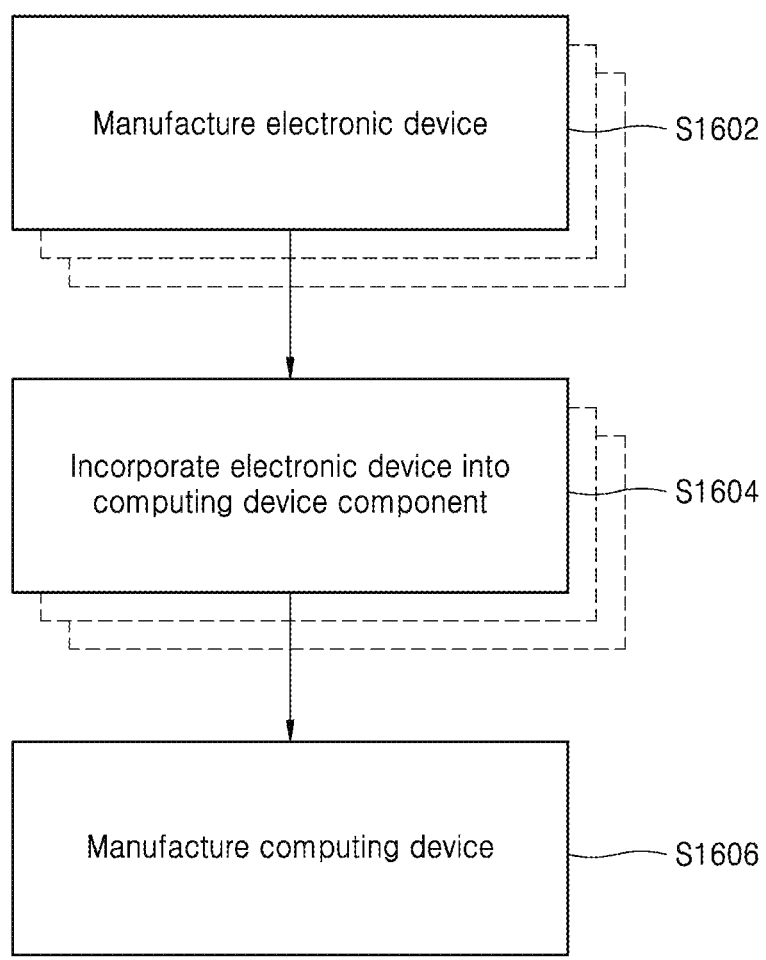
FIG. 10 is a flowchart illustrating a method implemented by the system illustrated in FIG. 9 to manufacture an electronic device according to some example embodiments.

FIG. 9 shows a schematic of a system 1500 configured to control the formation of an electronic device (e.g., "computing device") according to some example embodiments, and FIG. 10 is a flowchart illustrating a method implemented by the system 1500 to manufacture an electronic device (e.g., "computing device") according to some example embodiments. As shown, the system 1500 may include system 1301, which is configured to form one or more electronic devices 4000 according to any of the example embodiments of the inventive concepts (S1602), including forming one or more electronic device 4000 that include electronic device 400 according to the method shown in FIGS. 6A-6D. In some example embodiments, where the one or more electronic devices formed at S1602 are configured to be incorporated into a separate electronic device (e.g., "computing device", such as electronic device 1400), the one or more electronic devices formed at S1602 may be referred to as "sub-devices." For example, an electronic device 4000 formed based on system 1301 implementing a method for forming an electronic device (e.g., the method as shown in FIGS. 6A-6D) may be a logic transistor that is configured to be incorporated into an electronic device that is a computing device (e.g., electronic device 1400 as shown in FIG. 8). The system 1500 further includes a fabrication assembly 1504 that is configured to incorporate the electronic device(s) formed by system 1301 (e.g., electronic device 400) with various electronic device (e.g., "computing device") sub-components 1502 (where the sub-components 1502 may include printed circuit boards, power supplies, buses, communication interface components, processing circuitry components, memory components, any combination thereof, or the like). The fabrication assembly 1504 may incorporate the electronic device(s) 4000 that are sub-device(s) with the sub-components 1502 (S1604), to fabricate ("manufacture") electronic device (e.g., "computing device") components (e.g., processing circuitries 1420, memories 1430, any combination thereof, or the like) and/or electronic devices (e.g., "computing device") themselves, to manufacture ("fabricate") separate electronic device(s) 1400 (e.g., "computing devices") that include one or more electronic devices (e.g., electronic devices 100, 200, 300, and/or 400) according to any example embodiments of the inventive concepts (S1606). Such incorporation (S1604) and manufacturing (S1606) may include, for example, assembling an electronic device (e.g., "computing device") component (e.g., processing circuitry 1420 and/or memory 1430 based on incorporating said electronic devices to additional electronic device sub-components, etc.) based on coupling the electronic device(s) 4000 to one or more electronic device sub-components and coupling the electronic device component to other electronic device components (e.g., printed circuit board, or PCB) to manufacture the electronic device (e.g., 1400).

While some example embodiments have been described with reference to the figures, it will be understood by those of ordinary skill in the art that various changes in form and details may be made therein without departing from the spirit and scope as defined by the following claims.

What is claimed is:

1. An electronic device, comprising:
   a substrate;
   a dielectric layer on the substrate, the dielectric layer including a plurality of crystal grains defined by grain boundaries, the plurality of crystal grains having aligned crystal orientations such that the plurality of crystal grains have crystal planes parallel to each other, the crystal planes of the plurality of crystal grains being perpendicular to the aligned crystal orientations; and
   a gate electrode on the dielectric layer.

2. The electronic device of claim 1, further comprising:
   a channel layer on the substrate, wherein the channel layer is overlapped with the gate electrode in a direction that is perpendicular to a top surface of the substrate, and a source and a drain are provided on opposite sides of the channel layer in a direction that is parallel to the top surface of the substrate.

3. The electronic device of claim 2, wherein the channel layer includes at least one of Si, Ge, SiGe, Group III-V semiconductors, oxide semiconductors, nitride semiconductors, oxynitride semiconductors, 2D semiconductor materials, quantum dots, or organic semiconductors.

4. The electronic device of claim 1, wherein the dielectric layer includes a ferroelectric substance.

5. The electronic device of claim 1, wherein the dielectric layer includes an oxide of at least one of Hf, Si, Al, Zr, Y, La, Gd, or Sr.

6. The electronic device of claim 5, wherein the dielectric layer further includes a dopant.

7. The electronic device of claim 1, wherein the dielectric layer has a thickness, in a direction that is perpendicular to a top surface of the substrate, of about 0.5 nm to about 4 nm.

8. The electronic device of claim 1, wherein the plurality of crystal grains have <111> crystal orientations.

9. The electronic device of claim 1, further comprising:
   an amorphous dielectric layer between the substrate and the dielectric layer, between the dielectric layer and the gate electrode, or combinations thereof.

10. An electronic device comprising:
    a first electrode and a second electrode isolated from direct contact with each other; and
    a dielectric layer between the first electrode and the second electrode, wherein the dielectric layer includes a plurality of crystal grains defined by grain boundaries, the plurality of crystal grains having aligned crystal orientations such that the plurality of crystal grains have crystal planes parallel to each other, the crystal planes of the plurality of crystal grains being perpendicular to the aligned crystal orientations.

11. The electronic device of claim 10, wherein the first electrode and the second electrode include crystal grains having crystal orientations that are different from the aligned crystal orientations of the plurality of crystal grains of the dielectric layer.

12. The electronic device of claim 10, wherein the dielectric layer includes a ferroelectric substance.

13. The electronic device of claim 10, further comprising:
    a crystalline dielectric layer between the first electrode and the dielectric layer, between the second electrode and the dielectric layer, or combinations thereof, wherein the crystalline dielectric layer includes crystal grains having crystal orientations different from the aligned crystal orientations of the plurality of crystal grains of the dielectric layer.

14. A method of manufacturing an electronic device, the method comprising:
preparing a substrate having a channel layer;
forming a dielectric layer on the channel layer, wherein the dielectric layer includes a plurality of crystal grains defined by grain boundaries, the plurality of crystal grains having aligned crystal orientations such that the plurality of crystal grains have crystal planes parallel each other, the crystal planes of the plurality of crystal grains being perpendicular to the aligned crystal orientations; and
forming a gate electrode on the dielectric layer.

15. The method of claim 14, further comprising:
forming a crystalline dielectric layer between the substrate and the dielectric layer, between the dielectric layer and the gate electrode, or combinations thereof,
wherein the crystalline dielectric layer includes crystal grains having crystal orientations different from the aligned crystal orientations of the plurality of crystal grains of the dielectric layer.

16. The method of claim 14, wherein the forming of the dielectric layer includes depositing an amorphous dielectric material layer on the channel layer, and then crystallizing the amorphous dielectric material layer to form the dielectric layer, such that the crystallized amorphous dielectric material layer includes the plurality of crystal grains having the aligned crystal orientations.

17. The method of claim 14, wherein the dielectric layer includes a ferroelectric substance.

18. The method of claim 14, wherein the dielectric layer has a thickness of about 0.5 nm to about 4 nm.

19. A method of manufacturing a computing device, the method comprising:
manufacturing an electronic device according to the method of claim 18; and
forming the computing device based on incorporating the electronic device into a computing device component.

20. The method according to claim 19, wherein the computing device component includes at least one of a processing circuitry or a memory.

21. A method of manufacturing an electronic device, the method comprising:
forming a dielectric layer on a first electrode, the first electrode including a conductive metal, the dielectric layer including a plurality of crystal grains defined by grain boundaries, the plurality of crystal grains having aligned crystal orientations such that the plurality of crystal grains have crystal planes parallel to each other, the crystal planes of the plurality of crystal grains being perpendicular to the aligned crystal orientations; and
forming a second electrode on the dielectric layer, the second electrode including the conductive metal.

22. The method according to claim 21, further comprising:
forming at least one amorphous dielectric layer between the first electrode and the dielectric layer, between the dielectric layer and the second electrode, or combinations thereof.

23. The method according to claim 21, further comprising:
forming at least one crystalline dielectric layer between the first electrode and the dielectric layer, between the dielectric layer and the second electrode, or combinations thereof,
wherein the at least one crystalline dielectric layer includes crystal grains having crystal orientations different from the aligned crystal orientations of the plurality of crystal grains of the dielectric layer.

24. The method according to claim 21, wherein the forming of the dielectric layer includes depositing an amorphous dielectric material layer on the first electrode, and then crystallizing the amorphous dielectric material layer to form the dielectric layer, such that the crystallized amorphous dielectric material layer includes the plurality of crystal grains having the aligned crystal orientations.

25. A method of manufacturing a computing device, the method comprising:
manufacturing an electronic device according to the method of claim 21; and
forming the computing device based on incorporating the electronic device into a computing device component.

26. The method according to claim 25, wherein the computing device component includes at least one of a processing circuitry or a memory.

27. A system for manufacturing an electronic device, the system comprising:
a process chamber including a pedestal or chuck configured to structurally support one or more devices or layers in the process chamber;
a plurality of composition sources and a plurality of control devices, the plurality of composition sources coupled to the process chamber via separate, respective control devices of the plurality of control devices, each control device of the plurality of control devices configured to control a supply of a separate material held in a separate coupled composition source of the plurality of composition sources to the process chamber; and
processing circuitry configured to control at least the plurality of control devices to manufacture the electronic device based on
preparing a substrate having a channel layer on the pedestal or chuck,
forming a dielectric layer on the channel layer, wherein the dielectric layer includes a plurality of crystal grains defined by grain boundaries, the plurality of crystal grains having aligned crystal orientations such that the plurality of crystal grains have crystal planes parallel to each other, the crystal planes of the plurality of crystal grains being perpendicular to the aligned crystal orientations, and
forming a gate electrode on the dielectric layer.

28. The system of claim 27, wherein the processing circuitry is further configured to control at least the plurality of control devices to
form at least one amorphous dielectric layer between the substrate and the dielectric layer, between the dielectric layer and the gate electrode, or combinations thereof.

29. The system of claim 27, wherein the processing circuitry is further configured to control at least the plurality of control devices to
form at least one crystalline dielectric layer between the substrate and the dielectric layer, between the dielectric layer and the gate electrode, or combinations thereof, wherein the at least one crystalline dielectric layer includes crystal grains having crystal orientations different from the aligned crystal orientations of the plurality of crystal grains of the dielectric layer.

30. The system of claim 27, wherein the forming of the dielectric layer includes depositing an amorphous dielectric material layer on the channel layer, and then crystallizing the amorphous dielectric material layer to form the dielectric layer, such that the crystallized amorphous dielectric material layer includes the plurality of crystal grains having the aligned crystal orientations.

31. The electronic device of claim 1, further comprising:
a crystalline dielectric layer between the substrate and the dielectric layer, between the dielectric layer and the gate electrode, or combinations thereof,
wherein the crystalline dielectric layer includes crystal grains having crystal orientations that are different from the aligned crystal orientations of the crystal grains of the dielectric layer.

* * * * *